United States Patent
Sakaguchi

(10) Patent No.: US 10,666,244 B2
(45) Date of Patent: May 26, 2020

(54) COMPARATOR AND OSCILLATION CIRCUIT

(71) Applicant: ABLIC Inc., Chiba-shi, Chiba (JP)

(72) Inventor: Kaoru Sakaguchi, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/439,028

(22) Filed: Jun. 12, 2019

(65) Prior Publication Data

US 2019/0386650 A1 Dec. 19, 2019

(30) Foreign Application Priority Data

Jun. 15, 2018 (JP) .................. 2018-114785

(51) Int. Cl.
*H03K 3/012* (2006.01)
*H03K 3/0231* (2006.01)
*H03K 4/50* (2006.01)
*H03K 5/24* (2006.01)
*H03K 4/502* (2006.01)

(52) U.S. Cl.
CPC ........... *H03K 5/2481* (2013.01); *H03K 3/012* (2013.01); *H03K 3/0231* (2013.01); *H03K 4/502* (2013.01); *H03K 5/2472* (2013.01)

(58) Field of Classification Search
CPC ........ H03K 3/012; H03K 3/0231; H03K 4/12; H03K 4/50; H03K 4/502; H03K 5/24; H03K 5/2472; H03K 5/2481
USPC .................................................. 331/111, 143
See application file for complete search history.

(56) References Cited

U.S. PATENT DOCUMENTS

| 10,181,854 | B1* | 1/2019 | Kobayashi ..... H03K 19/018521 |
| 2008/0054949 | A1* | 3/2008 | Pera ..................... H03F 3/45183 |
| | | | 327/65 |
| 2010/0207666 | A1* | 8/2010 | Nakahara ............. H03K 5/2481 |
| | | | 327/78 |
| 2011/0227608 | A1* | 9/2011 | Floyd ................... H03K 5/2472 |
| | | | 327/63 |
| 2011/0316507 | A1* | 12/2011 | Wang ................... H03K 5/2481 |
| | | | 323/282 |
| 2014/0043562 | A1 | 2/2014 | Kikuchi |

FOREIGN PATENT DOCUMENTS

JP 2013-153288 8/2013

* cited by examiner

*Primary Examiner* — Levi Gannon
(74) *Attorney, Agent, or Firm* — Brinks Gilson & Lione

(57) ABSTRACT

A comparator includes a first constant current source, a first transistor having a drain connected to the first constant current source, a gate connected to a non-inverted input terminal, and a source connected to an inverted input terminal, a second constant current source connected between the inverted input terminal and a second power supply terminal, a second transistor having a source connected to a first power supply terminal, a gate connected to the drain of the first transistor, and a drain connected to an output terminal, and a third constant current source connected between the drain of the second transistor and the second power supply terminal. An oscillation circuit includes comparators in which at least one of the comparators is a comparator described above.

8 Claims, 9 Drawing Sheets

COMPARATOR AND OSCILLATION CIRCUIT

RELATED APPLICATIONS

Priority is claimed on Japanese Patent Application No. 2018-114785, filed on Jun. 15, 2018, the content of which is incorporated herein by reference.

BACKGROUND OF THE INVENTION

1. Field of the Invention

The present invention relates to a comparator and an oscillation circuit using the comparator.

2. Description of the Related Art

A conventionally used comparator includes a differential amplifier circuit amplifying a differential voltage from two input terminals and a source-grounded amplifier circuit for an output stage. It is common that a differential pair of the differential amplifier circuit and the source-grounded amplifier circuit are biased by a constant current source or a current generated by a resistor. The response speed of the comparator in this aspect is determined by the bias current.

When the bias current is reduced in order to suppress the current consumption of the circuit, the response speed decreases. On the contrary, a configuration which varies the bias current according to an input voltage of the comparator has been proposed as a means of achieving a high response speed while suppressing the current consumption (for example, see FIG. 3 of Japanese Patent Application Laid-Open No. 2013-153288).

Moreover, an oscillation circuit using a comparator which detects a voltage of a capacitor which is charged and discharged by a constant current source is also well known (for example, see FIG. 1 of Japanese Patent Application Laid-Open No. 2013-153288).

SUMMARY OF THE INVENTION

A conventional comparator circuit includes a plurality of current sources for biasing the differential pair of the differential amplifier circuit and the source-grounded amplifier circuit. It becomes difficult for the plurality of current sources to stably keep the output state due to a leak current or a noise when the current is excessively reduced. Hence, conventional comparators are limited in such a degree that the current consumption can be suppressed, and thus are not suitable for a semiconductor device which requires very low current consumption. Moreover, an oscillation circuit using the comparators is also similarly limited.

The present invention provides a comparator circuit of a simple configuration having low current consumption and an oscillation circuit having low current consumption.

A comparator according to an embodiment of the present invention includes an inverted input terminal, a non-inverted input terminal, and an output terminal, also includes a first constant current source having one terminal connected to a first power supply terminal, a first transistor having a drain connected to the other terminal of the first constant current source, a gate connected to the non-inverted input terminal, and a source connected to the inverted input terminal, a second constant current source having one terminal connected to the inverted input terminal, a control terminal connected to the output terminal, and the other terminal connected to a second power supply terminal, a second transistor having a source connected to the first power supply terminal, a gate connected to the drain of the first transistor, and a drain connected to the output terminal, and a third constant current source having one terminal connected to the drain of the second transistor and the other terminal connected to the second power supply terminal, in which the second constant current source is controlled by a voltage of the control terminal to turn on or turn off, and in which a current value of the first constant current source and a current value of the second constant current source are equal.

An oscillation circuit according to an embodiment of the present invention includes a first comparator, a second comparator, and a charge/discharge control circuit, in which at least one of the first comparator and the second comparator contains the above-described comparator.

According to the comparator of the present invention the current consumption can be reduced since all current paths between the first power supply and the second power supply are shut off in a state where the voltage difference between the inverted input terminal and the non-inverted input terminal is either positive or negative. Moreover, according to the oscillation circuit of the present invention the current consumption can be similarly reduced.

DETAILED DESCRIPTION OF THE PREFERRED EMBODIMENTS

Hereinafter, embodiments of the present invention are described with reference to the drawings.

Figure 1:
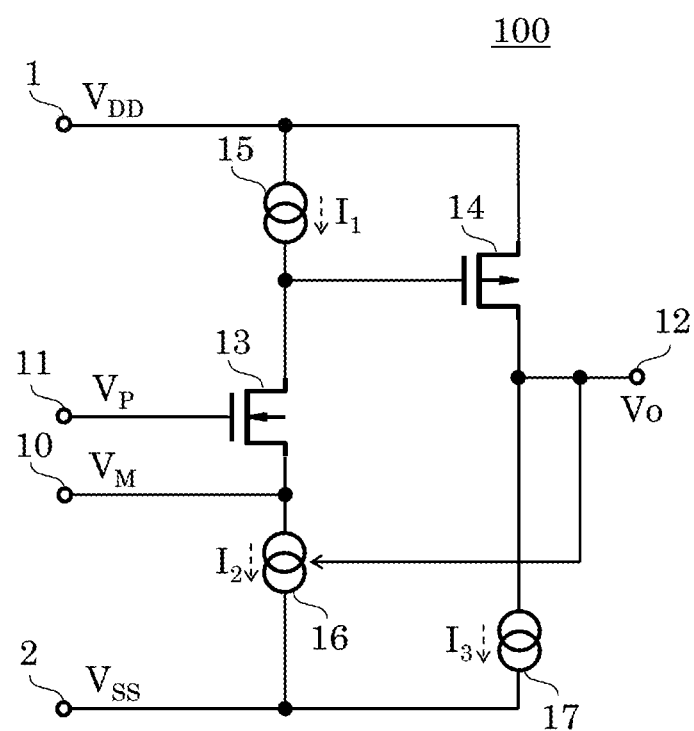
FIG. 1 is a circuit diagram illustrating a comparator according to a first embodiment of the present invention.

FIG. 1 is a circuit diagram illustrating a comparator according to the first embodiment of the present invention.

A comparator 100 according to the first embodiment includes an inverted input terminal 10, a non-inverted input terminal 11, an output terminal 12, an NMOS transistor 13, a PMOS transistor 14, and constant current sources 15, 16, and 17. The constant current source 16 has a control terminal to which a control signal is supplied to control the ON/OFF.

In the NMOS transistor 13, a gate is connected to the non-inverted input terminal 11, a source is connected to the inverted input terminal 10, and a drain is connected to one terminal of the constant current source 15 and a gate of the PMOS transistor 14. The other terminal of the constant current source 15 is connected to a power supply line 1. In the constant current source 16, one terminal is connected to the inverted input terminal 10, the other terminal is connected to a power supply line 2, and the control terminal is connected to the output terminal 12. In the PMOS transistor 14, a source is connected to the power supply line 1 and a drain is connected to the output tell signal 12. In the constant current source 17, one terminal is connected to the output terminal 12 and the other terminal is connected to the power supply line 2.

An operation of the comparator 100 having a configuration shown above is described below.

When a voltage $V_P$ of the non-inverted input terminal 11 is higher than a voltage $V_M$ of the inverted input terminal 10 and a voltage difference between the voltage $V_M$ and the voltage $V_P$ is equal to or larger than the threshold voltage of the NMOS transistor 13, the NMOS transistor 13 turns on. When the current driving capability of the NMOS transistor 13 surpasses the current $I_1$ of the constant current source 15, the NMOS transistor 13 enters a non-saturated state. When the NMOS transistor 13 enters the non-saturated state, the gate voltage of the PMOS transistor 14 becomes close to the voltage $V_M$, and then the PMOS transistor 14 turns on. When the current driving capability of the PMOS transistor 14 surpasses the current $I_3$ of the constant current source 17, the output voltage $V_O$ of the output terminal 12 is pulled-up to the vicinity of the voltage $V_{DD}$ of the power supply line 1. Accordingly, the comparator 100 supplies the output voltage $V_O$ of H level. The constant current source 16 provides the current $I_2$ when H level is supplied to the control terminal. Herein, since the current $I_1$ and the current $I_2$ are designed to coincide, the input current to the inverted input terminal 10 becomes almost zero. Accordingly, in the comparator 100, since the non-inverted input terminal 11 is an input terminal to the gate, the input current to each input terminal becomes small.

When the voltage difference between the voltage $V_M$ of the inverted input terminal 10 and the voltage $V_P$ of the non-inverted input terminal 11 is lower than the threshold voltage of the NMOS transistor 13 or when the voltage $V_M$ is higher than the voltage $V_P$, the NMOS transistor 13 turns off. Since the gate voltage of the PMOS transistor 14 is pulled-up to the $V_{DD}$ by the current $I_1$ of the constant current source 15, the PMOS transistor 14 turns off. When the PMOS transistor 14 turns off, the output voltage $V_O$ of the output terminal 12 is pulled-down to the vicinity of a voltage $V_{SS}$ of the power supply line 2 by the constant current source 17. Accordingly, the comparator 100 supplies the output voltage $V_O$ of L level. The constant current source 16 stops the output of the current $I_2$ when L level is supplied to the control terminal. Since the NMOS transistor 13 turns off and the constant current source 16 also stops the current output, the input current of the inverted input terminal 10 becomes almost zero. Accordingly, the input current to each input terminal becomes small similar to the case when the output voltage $V_O$ is at H level in the comparator 100.

In the comparator 100, when the output voltage $V_O$ is at L level, since both the NMOS transistor 13 and the PMOS transistor 14 turn off, the current paths between the power supply line 1 and the power supply line 2 are blocked so that the current consumption becomes almost zero.

Moreover, even when the input terminal receives a voltage from a high impedance node, a load effect is low, and thus a comparison with sufficient accuracy can be achieved since the input current can be reduced by varying the current supplied from the constant current source 16 by the output terminal voltage as described above.

The constant current sources 15, 16, and 17 each can be achieved by a MOS transistor receiving a voltage from the same bias line to a gate. Accordingly, the comparator 100 can be constituted by five transistors at the minimum and can reduce the current consumption while suppressing the circuit area with a simple configuration.

Figure 2:
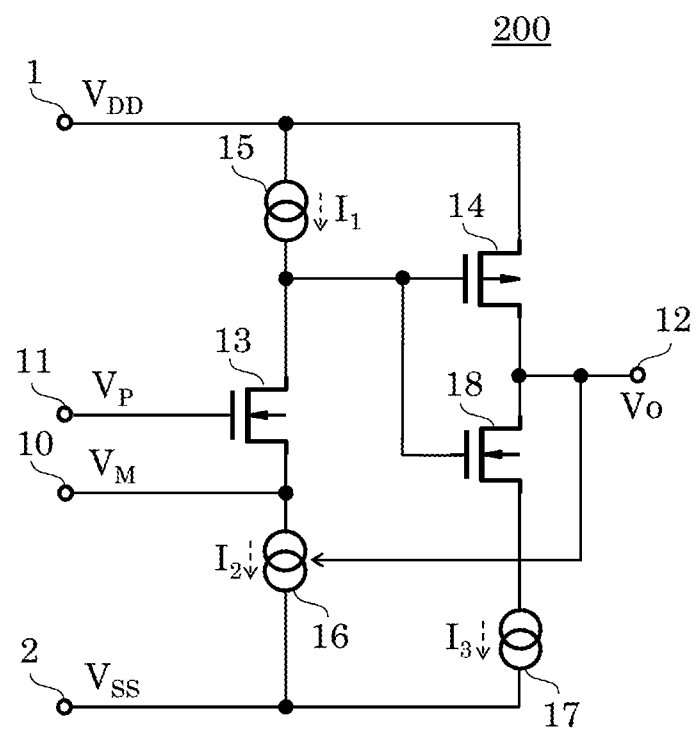
FIG. 2 is a circuit diagram illustrating another example of the comparator according to the first embodiment.

FIG. 2 is a circuit diagram illustrating another example of the comparator according to the first embodiment.

A comparator 200 of FIG. 2 has a configuration in which an NMOS transistor 18 is added to the comparator 100 of FIG. 1. Since the other configurations are the same as those of the comparator 100, the same constituent components are designated by the same reference numerals and a redundant description is omitted as appropriate.

In the NMOS transistor 18, a gate is connected to the gate of the PMOS transistor 14, a source is connected to the one terminal of the constant current source 17, and a drain is connected to the output terminal 12.

In the comparator 200 of the above-described configuration, when the voltage $V_P$ and the voltage $V_M$ are voltages which turn on the NMOS transistor 13 and further the voltage $V_M$ is lower than a threshold voltage of the NMOS transistor 18, the NMOS transistor 18 turns off, and thus the current 13 of the constant current source 17 does not flow through the on-state PMOS transistor 14. Accordingly, in a state where the output voltage $V_O$ is at H level, a path through the NMOS transistor 13 is an only current path between power supply lines of the comparator 200.

As described above, the comparator 200 shown in FIG. 2 can reduce the current consumption when the output voltage $V_O$ is at H level by adding one transistor to the comparator 100 shown in FIG. 1.

Figure 3:
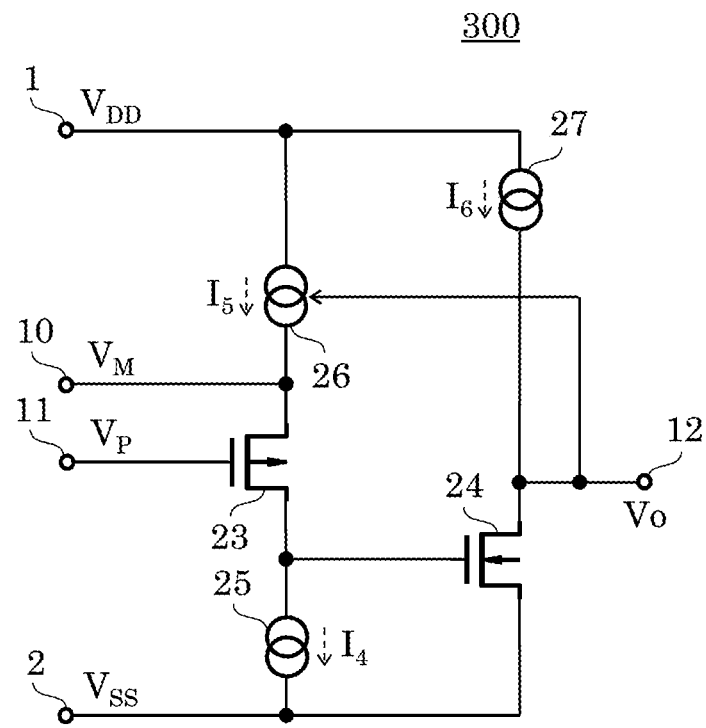
FIG. 3 is a circuit diagram illustrating a comparator according to a second embodiment.

FIG. 3 is a circuit diagram illustrating a comparator according to the second embodiment.

A comparator 300 includes the inverted input terminal 10, the non-inverted input terminal 11, the output terminal 12, a PMOS transistor 23, an NMOS transistor 24, and constant current sources 25, 26, and 27. The constant current source 26 has a control terminal to which a control signal is applied to control the ON/OFF.

In the PMOS transistor 23, a gate is connected to the non-inverted input terminal 11, a source is connected to the inverted input terminal 10, and a drain is connected to one terminal of the constant current source 25 and a gate of the NMOS transistor 24. In the constant current source 25, the other terminal is connected to the power supply line 2. In the constant current source 26, one terminal is connected to the inverted input terminal 10, the other terminal is connected to the power supply line 1, and the control terminal is connected to the output terminal 12. In the NMOS transistor 24, a source is connected to the power supply line 2 and a drain is connected to the output terminal 12. In the constant current source 27, one terminal is connected to the output terminal 12 and the other terminal is connected to the power supply line 1.

An operation of the comparator 300 having a configuration shown above is described below.

When the voltage $V_M$ of the inverted input terminal 10 is higher than the voltage $V_P$ of the non-inverted input terminal 11 and a voltage difference between the voltage $V_M$ and the voltage $V_P$ is equal to or hither than a threshold voltage of the PMOS transistor 23, the PMOS transistor 23 turns on. When the current driving capability of the PMOS transistor 23 surpasses the current 14 of the constant current source 25, the PMOS transistor 23 enters a non-saturated state. When the PMOS transistor 23 enters the non-saturated state, the gate voltage of the NMOS transistor 24 becomes close to the voltage $V_M$, and then the NMOS transistor 24 turns on. When the current driving capability of the NMOS transistor 24 surpasses the current I6 of the constant current source 27, the output voltage $V_O$ of the output terminal 12 is pulled-down to the vicinity of the voltage $V_{SS}$ of the power supply line 2. Accordingly, the comparator 300 supplies the output voltage $V_O$ of L level. The constant current source 26 provides the current $I_5$ when L level is supplied to the control terminal. Herein, since the current $I_4$ and the current $I_5$ are designed to coincide the input current to the inverted input terminal 10 becomes almost zero. Accordingly, since the non-inverted input terminal 11 is an input terminal to the gate, the input current to each input terminal becomes small in the comparator 300.

When the voltage difference between the voltage $V_P$ of the non-inverted input terminal 11 and the voltage $V_M$ of the inverted input terminal 10 is lower than the threshold voltage of the PMOS transistor 23 or the voltage $V_M$ is lower than the voltage $V_P$, the PMOS transistor 23 turns off. When the PMOS transistor 23 is turned off, the gate voltage of the NMOS transistor 24 is pulled-down to the voltage $V_{SS}$ by the current $I_4$ of the constant current source 25, and therefore the NMOS transistor 24 is turned off. When the NMOS transistor 24 turns off, the output voltage $V_O$ of the output terminal 12 is pulled-up to the vicinity of the voltage $V_{DD}$ of the power supply line 1 by the constant current source 27. Accordingly, the comparator 300 supplies the output voltage $V_O$ of H level. The constant current source 26 stops the output of the current $I_5$ when H level is supplied into the control terminal. Since the PMOS transistor 23 turns off and the constant current source 26 also stops the current output, the input current of the inverted input terminal 10 becomes almost zero. Accordingly, the input current to each input terminal becomes small similar to the case when the output voltage $V_O$ is at L level in the comparator 300.

Since both the PMOS transistor 23 and the NMOS transistor 24e turn off when the output voltage $V_O$ is at H level, the current paths between the power supply line 1 and the power supply line 2 are blocked so that the current consumption of the comparator 300 becomes almost zero.

Figure 4:
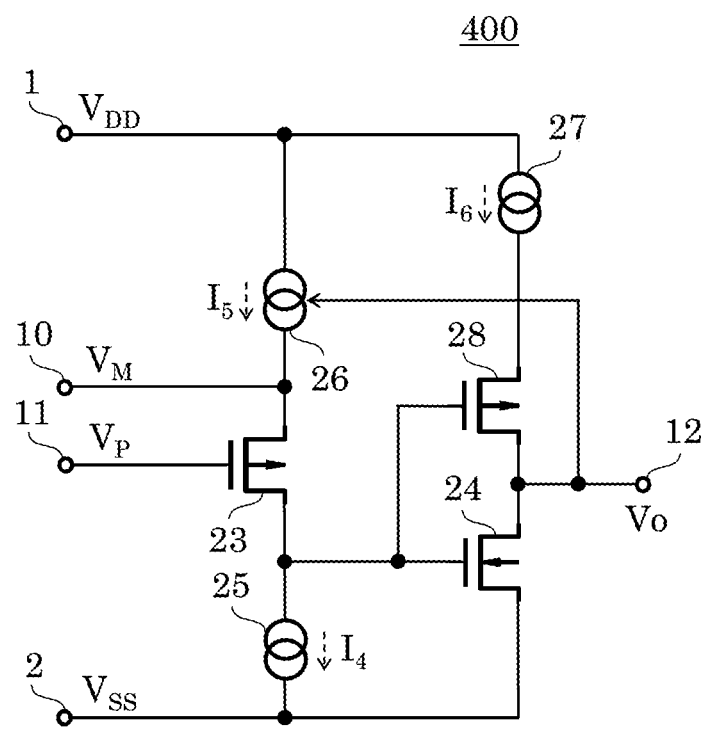
FIG. 4 is a circuit diagram illustrating another example of the comparator according to the second embodiment.

FIG. 4 is a circuit diagram illustrating another example of the comparator according to the second embodiment.

A comparator 400 of FIG. 4 has a configuration in which a PMOS transistor 28 is added to the comparator 300. Since the other configurations are the same as those of the comparator 300, the same constituent components are designated by the same reference numerals and a redundant description is omitted as appropriate.

In the PMOS transistor 28, a gate is connected to the gate of the NMOS transistor 24, a source is connected to the one terminal of the constant current source 27, and a drain is connected to the output terminal 12.

In the comparator 400 of the above-described configuration, when the voltage $V_P$ and the voltage $V_M$ are voltages which turn on the PMOS transistor 23 and further the voltage $V_M$ is higher than a threshold voltage of the PMOS transistor 28, the PMOS transistor 28 turns off, and thus the current $I_6$ of the constant current source 27 does not flow through the on-state NMOS transistor 24. Accordingly, in a state where the output voltage $V_O$ is at H level, a path through the PMOS transistor 23 is an only current path between power supply lines of the comparator 400.

As described above, the comparator 400 shown in FIG. 4 can reduce the current consumption when the output voltage $V_O$ is at L level by adding one transistor to the comparator 300 shown in FIG. 3.

The comparators according to the embodiments described above can reduce the current consumption to almost zero when the output voltage $V_O$ is at H level in the comparators 100 and 200 and when the output voltage $V_O$ is at L level in the comparators 300 and 400. Accordingly, the current consumption can be further reduced by properly using the comparators 100, 200, 300, and 400 as appropriate according to a length of the period when the output voltage $V_O$ is maintained.

Figure 5:
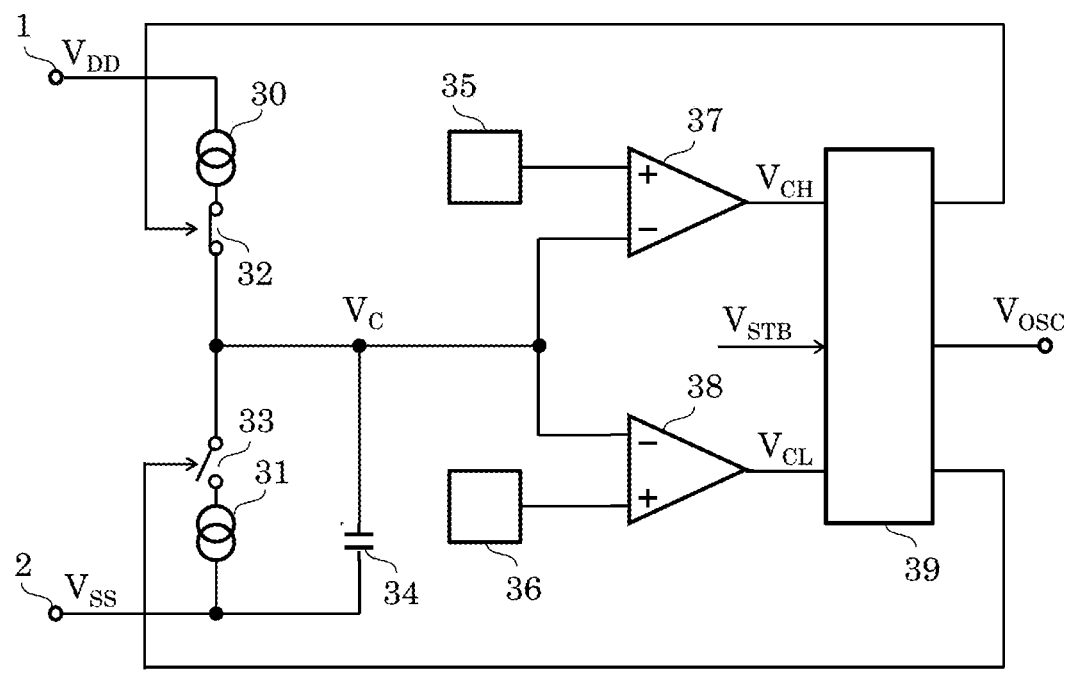
FIG. 5 is a circuit diagram illustrating an oscillation circuit using the comparators according to the embodiments.

FIG. 5 is a circuit diagram illustrating an oscillation circuit using the comparators according to the embodiments.

An oscillation circuit 500 of FIG. 5 includes constant current sources 30 and 31, switches 32 and 33, a capacitor 34, reference voltage circuits 35 and 36, comparators 37 and 38, and a charge/discharge control circuit 39. The reference voltage circuit 35 outputs a reference voltage $V_{REFH}$ based on the voltage $V_{SS}$ of the power supply line 2. The reference voltage circuit 36 outputs a reference voltage $V_{REFL}$ lower than the reference voltage $V_{REFH}$ based on the voltage $V_{SS}$ of the power supply line 2. For the comparators 37 and 38, any one of the comparators 100 to 400 of the present invention is used as appropriate. Herein, for simplification of explanation, the comparators 37 and 38 output an H level signal when the voltage of the non-inverted input terminal exceeds the voltage of the inverted input terminal.

In the constant current source 30, one terminal is connected to the power supply line 1 and the other terminal is connected to one conductive terminal of the switch 32. In the constant current source 31, one terminal is connected to the power supply line 2 and the other terminal is connected to one conductive terminal of the switch 33. The other conductive terminal of each of the switches 32 and 33 is connected to one terminal of the capacitor 34, an inverted input terminal of the comparator 37, and a non-inverted input terminal of the comparator 38. The other terminal of the capacitor 34 is connected to the power supply line 2. The reference voltage circuit 35 is connected to a non-inverted input terminal of the comparator 37. The reference voltage circuit 36 is connected to an inverted input terminal of the comparator 38. An output terminal of the comparator 37 is connected to a first input terminal of the charge/discharge control circuit 39. The output terminal of the comparator 38 is connected to a second input terminal of the charge/discharge control circuit 39. In the charge/discharge control circuit 39, a standby signal $V_{STB}$ is supplied to a control terminal, a charge control terminal is connected to a control terminal of the switch 32, a discharge control terminal is connected to a control terminal of the switch 33, and an output terminal is connected to an output terminal of the oscillation circuit 500.

Figure 6:
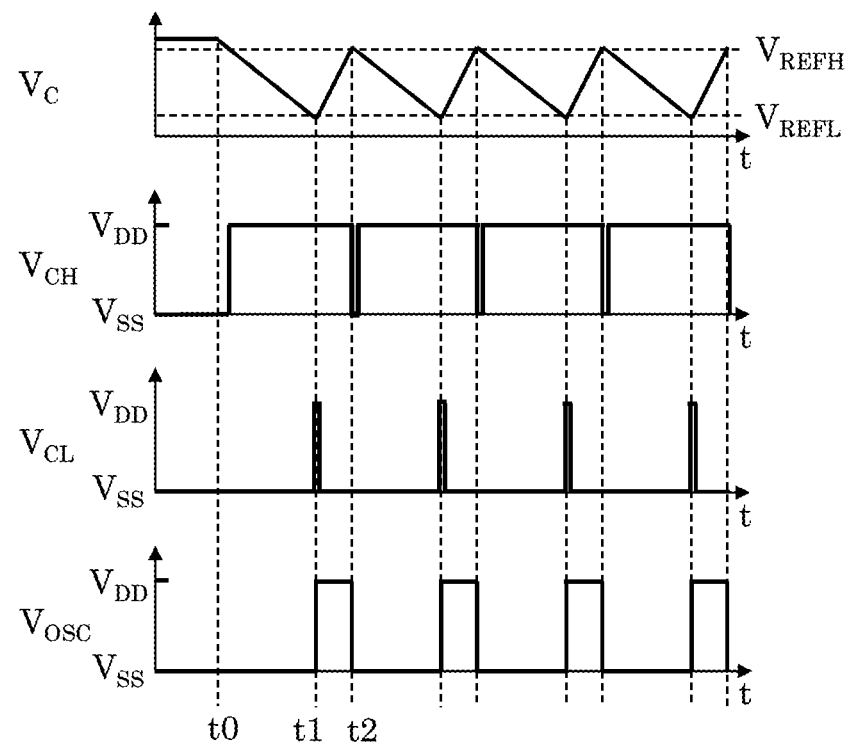
FIG. 6 is a timing chart for explaining an operation of the oscillation circuit of FIG. 5.

An operation of the oscillation circuit 500 having a configuration shown above is described below. FIG. 6 is a timing chart for explaining the operation of the oscillation circuit 500 using the comparator according to the embodiments of the present invention.

Before time t0, the voltage $V_C$ of the capacitor 34 is higher than the reference voltage $V_{REFH}$ and a standby signal $V_{STB}$ is supplied to the control terminal of the charge/discharge control circuit 39. The charge/discharge control circuit 39 outputs control signals which turn off the switches 32 and 33 from the charge control terminal and the discharge control terminal and outputs an L level signal $V_{OSC}$ from the output terminal in the standby state. When both the switches 32 and 33 are turned off, the input impedance of the comparators 37 and 38 is high, and thus the voltage $V_C$ of the capacitor 34 maintains the voltage higher than the reference voltage $V_{REFH}$. Since the voltage $V_C$ is higher than the reference voltage $V_{REFH}$, the comparator 37 outputs L level. Since the voltage $V_C$ is higher than the reference voltage $V_{REFL}$, the comparator 38 outputs L level.

At time t0, when the standby signal $V_{STB}$ is released, the charge/discharge control circuit 39 controls the switch 33 to turn on based on the L level output signal of the comparator 37. When the switch 33 turns on, the capacitor 34 is discharged by a current of the constant current source 31 (discharge state). Then, when the voltage $V_C$ becomes lower than the reference voltage $V_{REFH}$, the comparator 37 outputs H level.

When the capacitor 34 is discharged by the current of the constant current source 31 and the voltage $V_C$ becomes lower than the reference voltage $V_{REFL}$ at time t1, the comparator 38 outputs H level. The charge/discharge control circuit 39 controls the switch 32 to turn on and controls the switch 33 to turn off based on the H level output signal of the comparator 38. When the switch 32 turns on, the capacitor 34 is charged by a current of the constant current source 30 (charge state). Then, when the voltage $V_C$ becomes higher than the reference voltage $V_{REFL}$, the comparator 38 outputs L level. When an output signal of the comparator 38 changes to H level from L level, the charge/discharge control circuit 39 sets the signal $V_{OSC}$ to H level.

When the capacitor 34 is charged by the current of the constant current source 30 and the voltage $V_C$ becomes higher than the reference voltage $V_{REFH}$ at time t2, the comparator 37 outputs L level. The charge/discharge control circuit 39 controls the switch 32 to turn off and controls the switch 33 to turn on based on an L level output signal of the comparator 37. When the switch 33 is turned on, the capacitor 34 is discharged by the current of the constant current source 31.

When the output signal of the comparator 37 changes to L level from H level, the charge/discharge control circuit 39 sets the signal $V_{OSC}$ to L level.

By repeating the above-described operation, the oscillation circuit 500 outputs the signal $V_{OSC}$ from the output terminal. An oscillation cycle T of the signal $V_{OSC}$ is expressed by Expression (1) using a charge current $I_C$, a discharge current $I_D$, a capacity value C of the capacitor 34, and the reference voltages $V_{REFH}$ and $V_{REFL}$:

$$T = C \times (V_{REFH} - V_{REFL}) \times (I_C^{-1} + I_D^{-1}). \quad (1)$$

In Expression (1), to be precise, the threshold voltages of the input transistors (NMOS transistor 13) of the comparators 37 and 38 are included in the reference voltages $V_{REFH}$ and $V_{REFL}$, but a variation in the threshold voltage can be cancelled by similarly configuring the comparator 37 and the comparator 38. Accordingly, the accuracy of the oscillation cycle T of the oscillation circuit 500 can be increased without being affected by a variation in the characteristic of the NMOS transistor 13.

The oscillation circuit 500 described above can achieve very low current consumption without sacrificing the oscillation accuracy by the use of the comparator according to embodiments of the present invention.

Although not illustrated, when the comparator 37 is formed by the comparator of FIG. 1 or FIG. 2 and the comparator 38 is formed by the comparator of FIG. 1 or FIG. 2 whose output is inverted by an inverter, for example, the current consumption of the comparators 37 and 38 can be reduced to almost zero in the standby state of the oscillation circuit 500. For example, when the comparator 37 is formed by the comparator of FIG. 3 or FIG. 4 and the comparator 38 is formed by the comparator of FIG. 1 or FIG. 2, the current consumption of the comparators 37 and 38 under an oscillation operation can be reduced to almost zero.

Either one of the configurations described above may be selected as appropriate based on the length of the time of the standby state and the oscillation state in an electronic circuit to which the oscillation circuit is mounted.

It is desirable that the current values of the constant current sources 30 and 31 are set to be larger than the current values of the constant current sources 15, 16, 25, and 26 which determine the input current of the inverted input terminal of the comparator. Influence of the input current offset of the inverted input terminal of each comparator can be thereby reduced.

Figure 7:
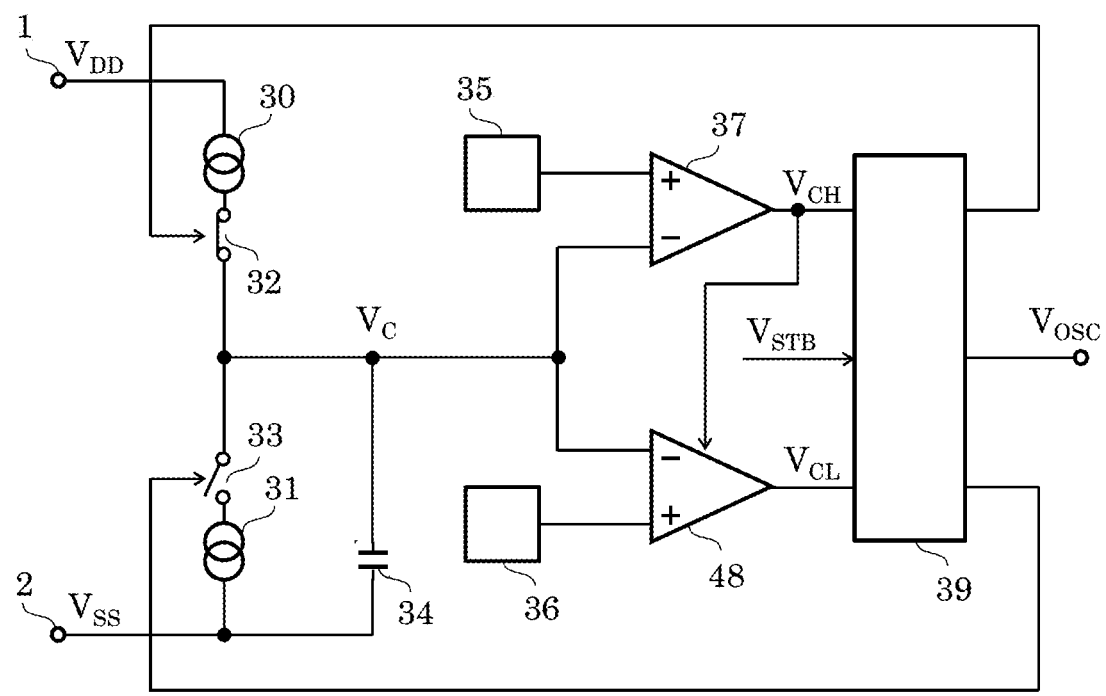
FIG. 7 is a circuit diagram illustrating another example of the oscillation circuit using the comparator according to one of the embodiments.

FIG. 7 is a circuit diagram illustrating another example of the oscillation circuit using the comparator according to one of the embodiments. An oscillation circuit 600 of FIG. 7 includes a comparator 48 in place of the comparator 38 of the oscillation circuit 500 of FIG. 5. The comparator 48 has a stop control terminal and a general differential amplifier circuit. The output terminal of the comparator 37 is connected to the stop control terminal of the comparator 48. Since the other configurations are the same as those of the oscillation circuit 500, the same constituent components are designated by the same reference numerals and a redundant description is omitted as appropriate.

When an L level signal is supplied to the stop control terminal, the comparator 48 fixes an output signal $V_{CL}$ to L level and consumes no current, e.g., controls to turn off an operating current of the differential amplifier circuit. Accordingly, even when the comparator 48 is a general comparator, the comparator 48 can prevent the comparator 37 from consuming current in the standby state.

As described above, according to the oscillation circuit 600, the current consumption of the comparator 37 and the comparator 48 can be reduced to almost zero in the standby state even when only the comparator 37 is formed by the comparator according to one of the embodiments.

Since the oscillation cycle T of the oscillation circuit 600 is affected by a variation in the threshold voltage of the input transistor (NMOS transistor 13) of the comparator 37, it is preferable for the oscillation circuit 600 to have a circuit configuration containing the reference voltage circuit 35 and the comparator 37 described below.

Figure 8:
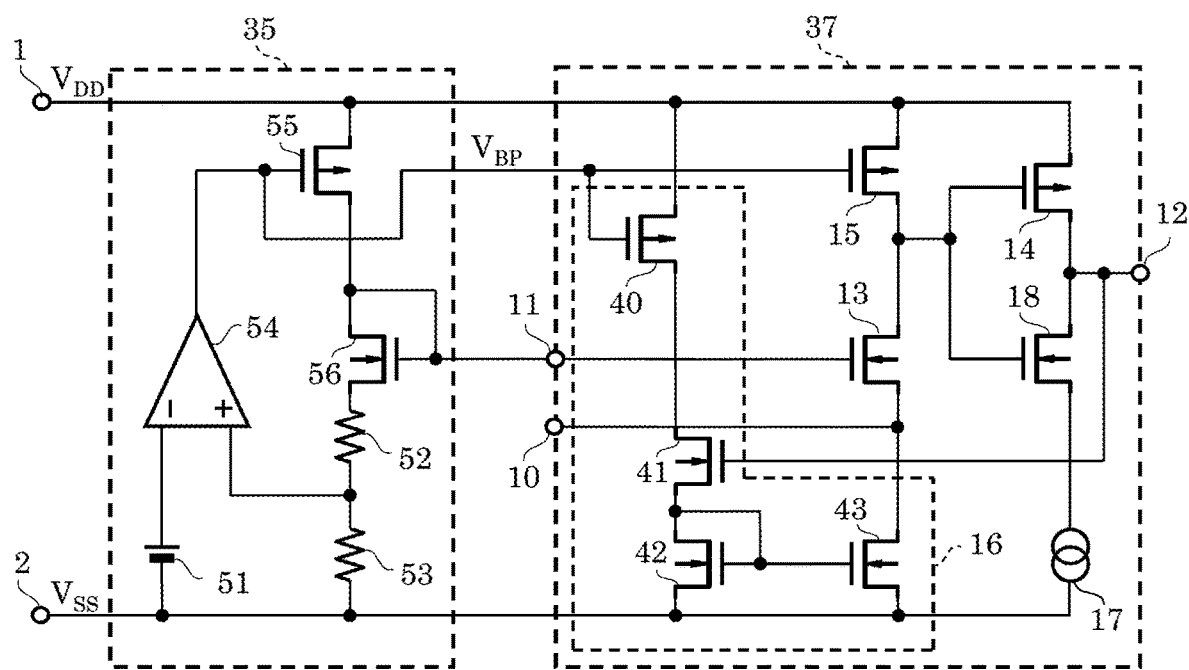
FIG. 8 is a circuit diagram illustrating a configurational example of a reference voltage circuit and a comparator used in the oscillation circuit according to the embodiment.

FIG. 8 is a circuit diagram illustrating a configurational example of the reference voltage circuit 35 and the comparator 37 used in the oscillation circuit according to the embodiment.

The reference voltage circuit 35 includes a reference voltage source 51, resistors 52 and 53, an error amplifier 54, a PMOS transistor 55, and an NMOS transistor 56. In the comparator 37, the corresponding circuit elements are designated by the same reference numerals with reference to the comparator 200 illustrated in FIG. 2. For example, the constant current source 15 is equivalently replaced by a PMOS transistor 15 and the constant current source 16 is equivalently replaced by a PMOS transistor 40 and NMOS transistors 41, 42, and 43. A gate of the NMOS transistor 41 is the control terminal which controls the ON/OFF of the constant current source 16.

In the error amplifier 54, the reference voltage source 51 is connected to an inverted input terminal, the connecting point of the resistor 52 and the resistor 53 is connected to a non-inverted input terminal, and an output terminal is connected to gates of the PMOS transistors 55, 40, and 15. In the PMOS transistor 55, a source is connected to the power supply line 1 and a drain is connected to a drain and a gate of the NMOS transistor 56. In the NMOS transistor 56, a drain and a gate are connected to the non-inverted input terminal 11 of the comparator 37 and a source is connected to the resistor 52.

In the PMOS transistor 40, a source is connected to the power supply line 1 and a drain is connected to a drain of the NMOS transistor 41. In the NMOS transistor 41, a gate is connected to the output terminal 12 of the comparator 37 and a source is connected to a drain and a gate of the NMOS transistor 42. In the NMOS transistor 42, a source is connected to the power supply line 2 and a drain and a gate are connected to a gate of the NMOS transistor 43. In the NMOS transistor 43, a source is connected to the power supply line 2 and a drain is connected to the inverted input terminal 10 of the comparator 37. The other circuits of the comparator 37 are connected in the same manner as in the comparator 200 of FIG. 2.

The error amplifier 54 controls a gate voltage of the PMOS transistor 55 so that a voltage of the connecting point of the resistor 52 and the resistor 53 is equal to a reference voltage supplied from the reference voltage source 51. The reference voltage source 51, the resistor 52, and the resistor 53 are set so that a voltage of the source of the NMOS transistor 56 is the reference voltage $V_{REFH}$.

The NMOS transistor 56 is biased by a current supplied by the PMOS transistor 55, generates a voltage higher than the reference voltage $V_{REFH}$ by the threshold voltage of the NMOS transistor 56 at the gate, and then provides the voltage to the gate of the NMOS transistor 13 as a voltage $V_P$. Since the same voltage as that provided to the PMOS transistor 55 is provided to the gate, the PMOS transistor 15 supplies a current proportional to the current of the PMOS transistor 55. When the W/L ratios of the NMOS transistor 56 and the NMOS transistor 13 are designed to be identical, gate-source voltages become equal in an operation of both the NMOS transistor 56 and the NMOS transistor 13 at a saturated state. Accordingly, the voltage $V_M$ of the inverted input terminal of the comparator 37 is equal to the reference voltage $V_{REFH}$.

Since the same voltage as that of the PMOS transistor 55 is supplied to the gate in the PMOS transistor 40, a current flowing through the current mirror composed from the NMOS transistors 42 and 43 also becomes a current proportional to the current of the PMOS transistor 55. Accordingly, the current of the PMOS transistor 15 and the current of the PMOS transistor 40, i.e., the current of the constant current source 16, can be easily made equal.

As described above, in the oscillation circuit 600 using the reference voltage circuit 35 and the comparator 37 of FIG. 8, the term ($V_{REFH}-V_{REFL}$) in Expression (1) is not affected by a variation in the characteristic of the NMOS transistor 13 and the accuracy of the oscillation cycle T can be increased.

Figure 9:
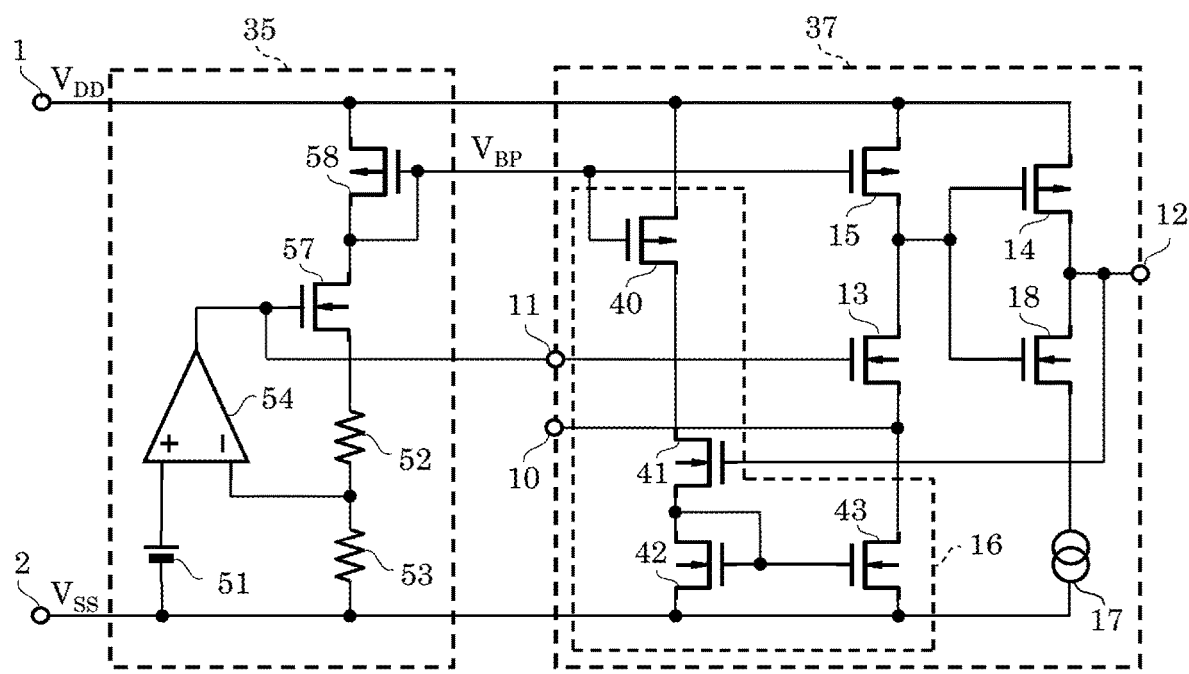
FIG. 9 is a circuit diagram illustrating another configurational example of the reference voltage circuit and the comparator used in the oscillation circuit according to the embodiment.

FIG. 9 is a circuit diagram illustrating another configurational example of the reference voltage circuit 35 used in the oscillation circuit according to the embodiment. The reference voltage circuit 35 includes a reference voltage source 51, resistors 52 and 53, an error amplifier 54, an NMOS transistor 57, and a PMOS transistor 58.

In the error amplifier 54, the reference voltage source 51 is connected to a non-inverted input terminal, the connecting point of the resistor 52 and the resistor 53 is connected to an inverted input terminal, and an output terminal is connected to a gate of the NMOS transistor 57 and the non-inverted input terminal 11 of the comparator 37. In the NMOS transistor 57, a source is connected to the resistor 52 and a drain is connected to a gate and a drain of the PMOS transistor 58. In the PMOS transistor 58, a source is connected to the power supply line 1.

The error amplifier 54 controls a gate voltage of the NMOS transistor 57 so that a voltage of the source of the NMOS transistor 57 is equal to the reference voltage $V_{REFH}$ by the setting of the reference voltage source 51, the resistor 52, and the resistor 53. The PMOS transistors 58, 40, and 15 each supply current proportional to each other in the same manner as in FIG. 8.

Accordingly, in the oscillation circuit 600 using the reference voltage circuit 35 and the comparator 37 illustrated in FIG. 9, the term ($V_{REFH}-V_{REFL}$) in Expression (1) is not affected by a variation in the characteristic of the NMOS transistor 13 and the accuracy of the oscillation cycle T can be increased.

As described above, the embodiments of the present invention are described. However, it is a matter of course that the present invention is not limited to the embodiments described above and can be variously altered without deviating from the gist of the present invention. For example, the comparator 37 and the comparator 48 may be reversed.

What is claimed is:

1. A comparator comprising:
an inverted input terminal, a non-inverted input terminal, and an output terminal;
a first constant current source having one terminal connected to a first power supply terminal;
a first transistor having a drain connected to another terminal of the first constant current source, a gate connected to the non-inverted input terminal, and a source connected to the inverted input terminal;
a second constant current source having one terminal connected to the inverted input terminal, another terminal connected to a second power supply terminal, and a control terminal connected to the output terminal;
a second transistor having a source connected to the first power supply terminal, a gate connected to the drain of the first transistor, and a drain connected to the output terminal; and
a third constant current source having one terminal connected to the drain of the second transistor and another terminal connected to the second power supply terminal,
wherein the second constant current source is controlled by a voltage of the control terminal to turn on or turn off, and
wherein a current value of the first constant current source and a current value of the second constant current source are equal.

2. The comparator according to claim 1 further comprising:
a third transistor having a source connected to the one terminal of the third constant current source, a gate connected to the drain of the first transistor, and a drain connected to the output terminal.

3. An oscillation circuit comprising:
a capacitor having one terminal connected to a second power supply terminal;
a charge current source connected between a first power supply terminal and another terminal of the capacitor through a first switch;
a discharge current source connected between the other terminal of the capacitor and the second power supply terminal through a second switch;

a first comparator having a non-inverted input terminal connected to a first reference voltage circuit, and an inverted input terminal connected to the other terminal of the capacitor;

a second comparator having a non-inverted input terminal connected to a second reference voltage circuit, and an inverted input terminal connected to the other terminal of the capacitor; and a charge/discharge control circuit having a first input terminal connected to an output terminal of the first comparator, a second input terminal connected to an output terminal of the second comparator, a charge control terminal connected to a control terminal of the first switch, a discharge control terminal connected to a control terminal of the second switch, and an output terminal, wherein at least one of the first comparator and the second comparator contains the comparator according to claim 1.

4. The oscillation circuit according to claim 3, wherein the first comparator contains the comparator according to claim 1, and the second comparator is controlled to stop operation based on an output signal from the first comparator.

5. The oscillation circuit according to claim 4, wherein the first reference voltage circuit has a fourth transistor having a gate connected to the gate of the first transistor and having a threshold voltage equal to a threshold voltage of the first transistor, and wherein a voltage of a source of the fourth transistor is a first reference voltage supplied from the first reference voltage circuit.

6. An oscillation circuit comprising:

a capacitor having one terminal connected to a second power supply terminal;

a charge current source connected between a first power supply terminal and another terminal of the capacitor through a first switch;

a discharge current source connected between the other terminal of the capacitor and the second power supply terminal through a second switch;

a first comparator having a non-inverted input terminal connected to a first reference voltage circuit, and an inverted input terminal connected to the other terminal of the capacitor;

a second comparator having a non-inverted input terminal connected to a second reference voltage circuit, and an inverted input terminal connected to the other terminal of the capacitor; and a charge/discharge control circuit having a first input terminal connected to an output terminal of the first comparator, a second input terminal connected to an output terminal of the second comparator, a charge control terminal connected to a control terminal of the first switch, a discharge control terminal connected to a control terminal of the second switch, and an output terminal, wherein at least one of the first comparator and the second comparator contains the comparator according to claim 2.

7. The oscillation circuit according to claim 6, wherein the first comparator contains the comparator according to claim 2, and the second comparator is controlled to stop operation based on an output signal from the first comparator.

8. The oscillation circuit according to claim 7, wherein the first reference voltage circuit has a fourth transistor having a gate connected to the gate of the first transistor and having a threshold voltage equal to a threshold voltage of the first transistor, and wherein a voltage of a source of the fourth transistor is a first reference voltage supplied from the first reference voltage circuit.

\* \* \* \* \*